United States Patent
Balke (10) Patent No.: US 7,538,539 B1
(45) Date of Patent: May 26, 2009

(54) CURRENT METER WITH REDUCED RANGE SWITCHING AND LOAD TRANSIENTS

(75) Inventor: Christian Balke, Munich (DE)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 12/117,034

(22) Filed: May 8, 2008

(51) Int. Cl.
    *G01R 15/08* (2006.01)
(52) U.S. Cl. .............. 324/115; 324/123 R; 324/126
(58) Field of Classification Search .......... None
    See application file for complete search history.

(56) References Cited

U.S. PATENT DOCUMENTS

| | | | |
|---|---|---|---|
| 4,659,997 A | 4/1987 | Ferland et al. | |
| 5,345,182 A | 9/1994 | Wakamatsu | |
| 5,528,136 A | 6/1996 | Rogoff et al. | |
| 6,194,910 B1 | 2/2001 | Davis et al. | |
| 6,292,010 B1 | 9/2001 | Persons et al. | |
| 6,448,748 B1 | 9/2002 | Taylor et al. | |
| 6,452,436 B1 | 9/2002 | Leip | |
| 6,603,301 B2 | 8/2003 | Benes | |
| 6,995,555 B2 * | 2/2006 | Graf | 324/126 |
| 7,403,030 B2 | 7/2008 | Walker et al. | |
| 2006/0290361 A1 | 12/2006 | Ellis | |

* cited by examiner

*Primary Examiner*—Minh N Tang
(74) *Attorney, Agent, or Firm*—Bruce D. Rubenstein (57) ABSTRACT

An ammeter for ATE instrumentation includes an amplifier, a first current measuring circuit coupled to the amplifier's power supply leads, and a second current measuring circuit coupled to the amplifier's output. The first current measuring circuit is used to select a desired current measurement range, away from the amplifier's output. Output transients caused by range changes are therefore avoided. The ammeter's response to load transients is also minimized, by providing smooth transitions between low current and high current operation.

26 Claims, 6 Drawing Sheets

CURRENT METER WITH REDUCED RANGE SWITCHING AND LOAD TRANSIENTS

CROSS-REFERENCES TO RELATED APPLICATIONS

Not Applicable.

STATEMENT REGARDING FEDERALLY SPONSORED RESEARCH OR DEVELOPMENT

Not Applicable.

NAMES OF PARTIES TO A JOINT RESEARCH AGREEMENT

Not Applicable

REFERENCE TO A "SEQUENCE LISTING," A TABLE, OR A COMPUTER PROGRAM LISTING APPENDIX

Not Applicable.

BACKGROUND OF THE INVENTION

1. Field of the Invention

This invention relates generally to electronic test and measurement, and, more particularly, to circuits for measuring current drawn from or provided by power supplies, parametric measurement units, and other instruments used in electronic test and measurement, including automatic test equipment.

2. Description of Related Art

A need commonly arises in electronic test and measurement (T&M) for measuring currents delivered to various loads. T&M includes automatic test equipment, or "ATE." ATE systems, or "testers," are complex, usually computer-driven, electronic systems for verifying the operation of electronic devices, circuits, or assemblies.

Figure 1:
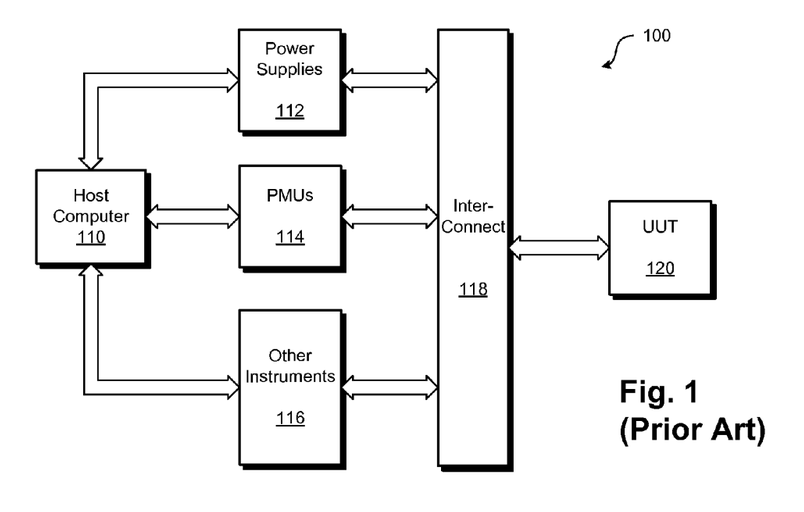
FIG. 1 is a highly simplified block diagram of a conventional automatic test system.

FIG. 1 is a high level block diagram of a tester 100. A host computer 110 runs a test program developed for testing a unit under test, or UUT 120. The host computer 110 interactively communicates with power supplies 112, PMUs 114, and other instruments 116. These instruments provide stimuli to and/or monitor responses from the UUT 120 via an interconnect 118. Examples of testers are well known in the art, and include the Catalyst™, Tiger™, Panther™, FLEX™, and UltraFLEX™ test systems, designed by Teradyne, Inc. of North Reading, Mass.

One electronic instrument that involves current measurements is the parametric measurement unit, or "PMU." As is known, a PMU is an electronic instrument for applying regulated voltages and/or currents to UUTs, and for measuring voltages and/or currents from UUTs. Tasks performed by PMUs typically include forcing a voltage to a node or pin of a UUT and measuring the resulting current that flows (FVMI). They also include forcing a current to the UUT and measuring the resulting voltage manifested as a result of that forced current (FIMV).

Figure 2:
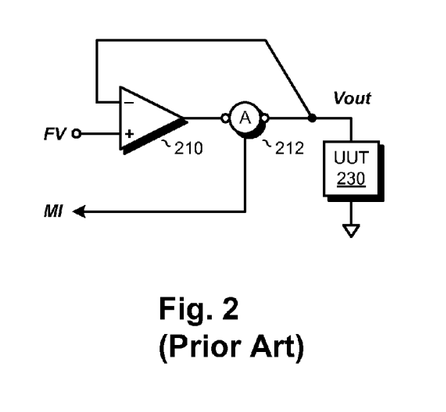
FIG. 2 is a simplified schematic of a conventional circuit for forcing a voltage and measuring a current.

FIG. 2 shows a conventional arrangement for effecting FVMI testing of a UUT 230 with a PMU. An amplifier, such as a power op amp 210, receives a programming signal, FV, and produces a corresponding output voltage, Vout. The programming signal is generally designated by the test program. Current flows through the UUT in response to Vout. The current may be the leakage current of a semiconductor device, for example. An ammeter 212 is coupled in series with the output of the power op amp 210 and provides a measure of current (MI) flowing into the UUT 230. The measured current may be reported back to the test program to determine whether it falls within acceptable limits.

Figure 3:
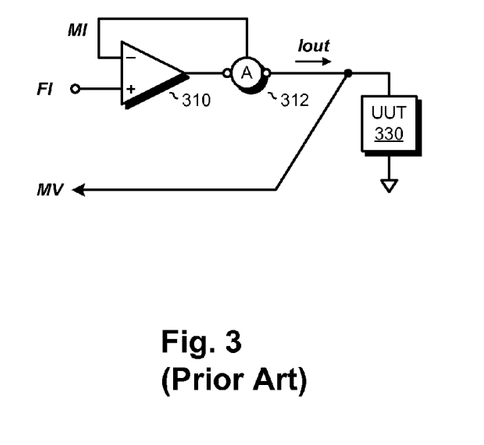
FIG. 3 is a simplified schematic of a conventional circuit for forcing a current and measuring a voltage.

FIG. 3 shows a conventional arrangement for effecting FIMV testing of a UUT 330 with a PMU. This arrangement may be established by reconfiguring the same PMU shown in FIG. 2. Here, a power op amp 310 receives a current programming signal, FI, from the test program and produces a corresponding output current, Iout. An ammeter 312 is coupled in series with the output of the power op amp 310 to provide a measure of current. The current is fed back to the power op amp 310, allowing negative feedback to maintain the desired current. The output current Iout flows through the UUT and manifests a voltage (MV). The voltage may be reported back to the test program to determine whether it meets the test limits.

FVMI and FIMV arrangements are directly relevant to power supplies as well as PMUs. Power supplies delivering output voltages generally operate in FVMI mode. They not only generate regulated output voltage, but also provide a measure of resulting output current. Some power supplies act as current sources. In these instances, they may operate in FIMV mode, regulating output current while providing a measure of output voltage. Indeed some power supplies can operate in both FVMI and FIMV modes, transitioning between them as the load changes.

Figure 4:
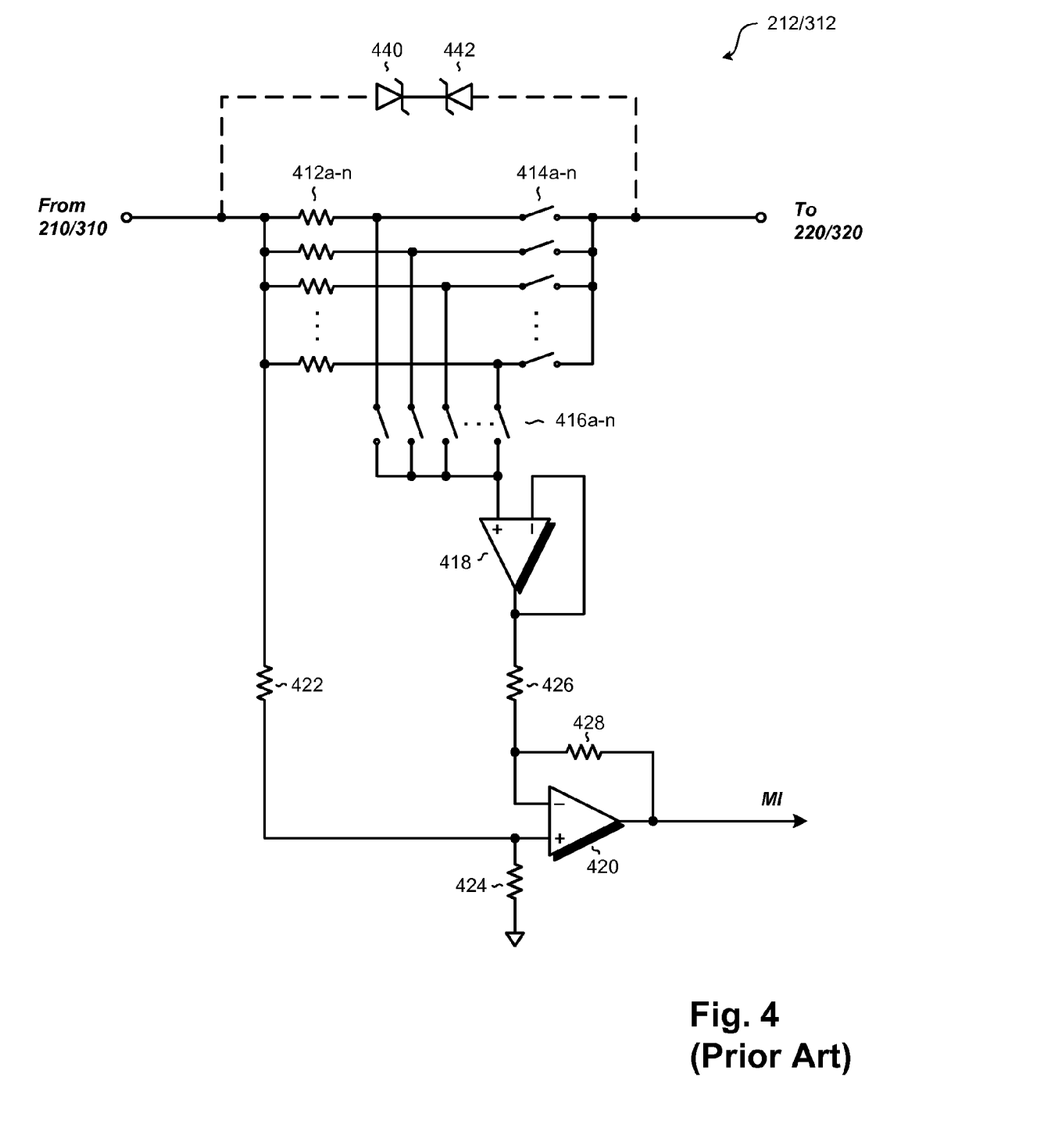
FIG. 4 is a more detailed schematic of a conventional circuit for measuring a current.

The ammeter is a critical design element for both PMUs and power supplies. FIG. 4 shows a more detailed view of a conventional ammeter 212/312. The ammeter 212/312 includes a bank of resistors 412a-n connected between the ammeter's input and output. The ammeter also includes a bank of switches 414a-n. The switches 414a-n allow the resistors 412a-n to be individually selected. For example, closing the switch 414a (the top switch) and opening the other switches 414b-n ensures that all current flowing from the input to the output of the ammeter passes through resistor 412a (the top resistor).

The individually selectable resistors 412a-n equip the ammeter with different current ranges. The resistors 412a-n are commonly provided with decade spacing, e.g., 1-ohm, 10-ohms, 100-ohm, and so forth. By selecting a different resistor, a different current range is configured. Low value resistors (e.g., 1-ohm or 10-ohms) allow high current measurements, whereas high value resistors (e.g. 10 k-ohm or 100 k-ohm) allow accurate measurements of low currents. The resistors are preferably very stable over time and temperature and have precisely known values.

The current flowing through the ammeter 212/312 can be determined by measuring the voltage across the selected resistor and applying Ohm's Law. The ammeter includes a differential amplifier (op amp 420 and resistors 422, 424, 426, and 428) to perform this function.

The ammeter 212/312 includes other components to avoid errors. As current flows through the selected resistor, a voltage drop appears across its associated switch (one of 414a-n). For large currents, this voltage drop can contribute a substantial error. A second bank of switches 416a-n is included to prevent this voltage drop from appearing in current measurements. Only one switch 416a-n is closed at a time. If the resistor 412a is selected, for example, only the switch 416a (leftmost switch) is closed. Any voltage drop across the switch 414a that results from current flow through the switch is therefore not included in the signal sent to the differential amplifier. Another component that avoids errors is the voltage buffer 418. The voltage buffer 418 is disposed between the switches 416a-n and the differential amplifier to ensure that no current is drawn from the output side of the ammeter, where it would contribute a direct measurement error. The voltage buffer 418 also ensures that no significant voltage drop appears across any of the switches 416a-n, which would also contribute an error.

Although the ammeter 212/312 performs well and with high precision, we have recognized that it is not always optimal. Consider the case in which an instrument (e.g., a power supply or PMU) is configured for FVMI operation and programmed to output a desired voltage into a UUT having an unknown resistance. An initial current range may be selected; however, the optimal current range may be different from the initial setting. Since changing current ranges involves opening and closing certain of the switches 414a-n and 416a-n, changing the current range can cause abrupt changes in the output impedance of the instrument. Changing the current range can thus disturb feedback signals of the instrument, causing transient responses that can damage the UUT and take significant time to settle. If the load is inductive, a sudden change in output impedance may cause a voltage spike that can damage the UUT or the instrument itself. A different type of problem can occur when the switches 414a-n and 416a-n are implemented with analog switches. Changing switch positions with the instrument connected to the load can cause charge to be injected from the analog switches into the load, disturbing and potentially damaging the load.

Performance of the ammeter 212/312 may also suffer when the impedance of the UUT suddenly changes while a voltage is being applied. Consider the case in which an ammeter 212/312 is used in a tester power supply to provide current to a UUT, such as a microcontroller. As is known, some microcontrollers have a low current "idle" mode in which they consume very little power; however, they can switch rapidly to a high current operating mode. If the ammeter is configured for measuring the microcontroller's idle current, the optimal range will involve a high value resistor 412, such as 100 k-ohms or more. With such a high value resistor selected for the ammeter, the power supply will have a high output impedance. A subsequent transition of the microcontroller to its operating mode will then cause the power supply's output voltage to drop. Output voltage will fall, essentially to zero, and the microcontroller will cease to operate. Testing of the microcontroller will then be compromised.

To some extent, this problem can be avoided by providing an alternative, conductive path around the ammeter. For example, a pair of oppositely oriented zener diodes 440 and 442 may be connected in series between the input and output of the ammeter 212/312. With this arrangement, the zener diodes may conduct (one forward and one reverse) when the microcontroller is switched from idle mode to operating mode. Output voltage regulation may eventually be reestablished with output current supplied through the zener diodes. However, regulation does not generally resume until after a deep and sometimes lengthy drop in output voltage, which typically will be enough to reset the microcontroller and compromise the test. Another, typically smaller, transient will often ensue when a high current range is later selected and the zener diodes turn off.

What is needed, therefore, is an ammeter that does not suffer from damaging output transients when different current ranges are selected or when the load changes impedance.

BRIEF SUMMARY OF THE INVENTION

In accordance with one embodiment of the invention, a circuit for measuring current to a load includes an output node, for coupling to the load, and an amplifier having an output, a first power supply node, and a second power supply node. A first current measuring circuit is coupled to the first and second power supply nodes of the amplifier and has an output for providing a first indication of current to the load. In addition, a second current measuring circuit is coupled between the output of the amplifier and the output node and has an output for providing a second indication of current to the load.

In accordance with another embodiment of the invention, a circuit for providing electrical power to a load includes an output node, for connecting to the load, and an amplifier having a first input for receiving an input signal, a second input for receiving a feedback signal, a first power supply node, a second power supply node, and an output. A low current measuring circuit is coupled between the output of the amplifier and the output node and has an output for providing a low current measurement signal. In addition, a high current measuring circuit is coupled to the first and second power supply nodes of the amplifier and has an output for providing a high current measurement signal. A feedback path is coupled between the second input of the amplifier and one of the output node, the output of the low current measuring circuit, and the output of the high current measuring circuit.

In accordance with a further embodiment of the invention, a method of measuring current flowing to a load includes providing a first amplifier having an output for coupling to the load and providing a second amplifier having an input coupled to the output of the first amplifier and an output for coupling to the load. The method further includes measuring a difference between a first supply current and a second supply current of the first amplifier to produce a first indication of current flowing to the load, and measuring a current from the output of the second amplifier to produce a second indication of current flowing to the load.

In accordance with a still further embodiment of the invention, a circuit for measuring current flowing to a load includes an output node for coupling to the load, a first amplifier having first and second power supply nodes and an output coupled to the output node, and a second amplifier having an input coupled to the output of the first amplifier and an output coupled to the output node. The circuit further includes a first measuring circuit, coupled to the first and second power supply nodes of the first amplifier, for measuring current flow between the first amplifier and the load, and a second measuring circuit, coupled to the second amplifier, for measuring current flow between the second amplifier and the output node.

In accordance with yet another embodiment of the invention, a circuit for measuring current flowing to a load includes an output node, for coupling to the load, and a first amplifier having first and second power supply nodes and an output. The circuit further includes a series element having a first node coupled to the output of the first amplifier and a second node coupled to the output node. The series element has a high impedance between the first and second nodes when substantially zero volts are applied therebetween and has a lower impedance between the first and second nodes when a greater voltage is applied therebetween. The circuit still further includes a second amplifier having first and second inputs coupled respectively to the first and second nodes of the series element, and an output coupled to the second node of the series element for maintaining substantially 0 volts across the series element when low current is being delivered to the load. The circuit also includes a measurement circuit coupled to the first and second power supply nodes of the first amplifier for measuring current to the load when a high current is being delivered to the load.

DETAILED DESCRIPTION OF THE INVENTION

As used throughout this document, the words "comprising," "including," and "having" are intended to set forth certain items, steps, elements, or aspects of something in an open-ended fashion. Unless a specific statement is made to the contrary, these words do not indicate a closed list to which additional things cannot be added. In addition, the words "connected" and "coupled" and variants thereof are used interchangeably to indicate connections between components that may be either direct or indirect. Unless a specific statement is made to the contrary, nothing prevents two things that are "connected" or "coupled" from being connected or coupled through some third component or components.

Figure 5:
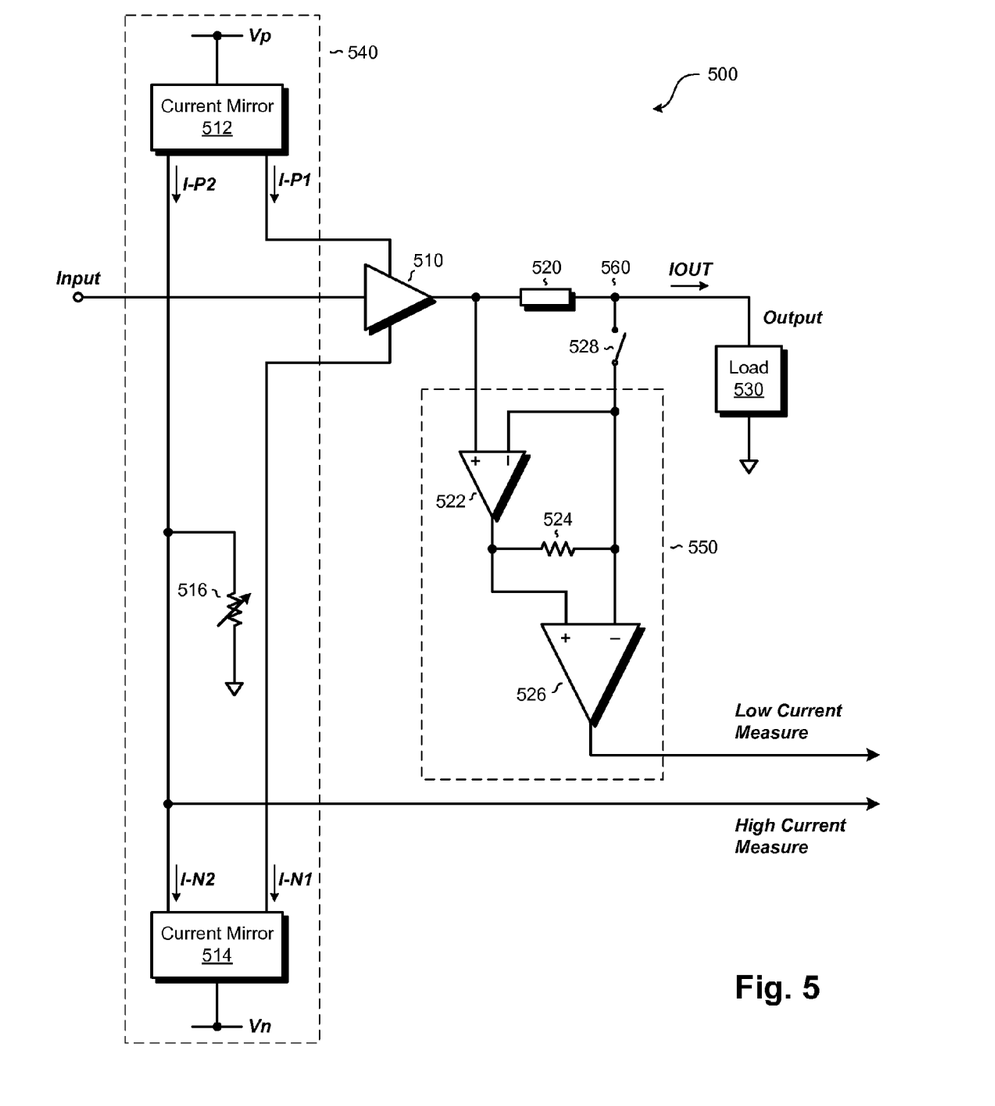
FIG. 5 is a simplified schematic of a circuit for measuring current according to one embodiment of the invention.

FIG. 5 shows a circuit 500 for measuring current according to an illustrative embodiment of the invention. An amplifier 510, such as a power amplifier or power op amp, has one or more inputs (a single input is shown), an output, and first and second power supply nodes, e.g., leads or terminals. The first and second power supply nodes of the amplifier 510 are coupled to a first current measuring circuit 540, and the output of the amplifier 510 is coupled to a second current measuring circuit 550. The circuit for measuring current has an output node 560, which can be connected to a load 530, such as a UUT. The circuit also includes a series element 520, coupled between the output of the amplifier 510 and the output node 560. The series element 520 is preferably a device or circuit that has high impedance when low voltage (near zero volts) is applied across its terminals but has low impedance when a higher voltage is applied. One example of a suitable series element is a pair of antiparallel diodes, such as Schottky diodes.

The circuit 500 is not shown in any particular feedback configuration; however, it is understood that the circuit 500 may be used as part of an FVMI or an FIMV, for use in a power supply, PMU, or other instrument. It may also be used for forcing a current (FI), without providing a voltage measurement function.

The amplifier 510 can be realized as a power op amp with both an inverting input and a non-inverting input. It can then be configured like the amplifier 210 of FIG. 2, to provide FVMI operation, or like the amplifier 310 of FIG. 3, to provide FIMV (or simply FI) operation. As another example, the amplifier 510 may be realized as a high current buffer. A control op amp could then be made to drive the high current buffer. The control op amp could then receive input and feedback signals to realize the arrangement of FIGS. 2 and/or 3.

As shown, the first current measuring circuit 540 includes a first current mirror 512, a second current mirror 514, and an adjustable/variable resistor 516, such as a bank of individually selectable resistors. The first current mirror 512 preferably receives and produces current with reference to a positive supply voltage, Vp, and the second current mirror 514 preferably receives and produces current with reference to a negative supply voltage, Vn.

The second current measuring circuit 550 includes an amplifier 522, such as an op amp, a feedback resistor 524, and a differential amplifier 526. The amplifier 522 and differential amplifier 526 each receive power from local power sources, such as Vp and Vn. The differential amplifier 526 has a first input coupled to the output of the amplifier 522 and a second input coupled to the output node 560. The differential amplifier 526 may be implemented as an instrumentation amplifier, for example. The second input should preferably have high input impedance to avoid introducing an error current. A switch 528 may be provided for selectively disengaging the second current measuring circuit 550. Preferably, the switch 528 is opened when the first current measuring circuit 540 is being used and is closed when the second current measuring circuit 550 is being used.

The first current measuring circuit 540 operates under the principle that the sum of all the currents into the amplifier 510 must equal zero. If it is assumed that zero (or essentially zero) current flows into the input(s) of the amplifier, then the current from the output of the amplifier 510 must equal the current into the first power supply node minus the current out of the second power supply node. The first current measuring circuit 540 measures the current from the amplifier 510 essentially by performing this subtraction. The first current mirror 512 produces a facsimile of the current into the first power supply node, I-P1, to produce the output current I-P2. Similarly, the second current mirror 514 produces a facsimile of the current out of the second power supply node, I-N1, to produce the output current I-N2. The currents I-P2 and I-N2 are merged together at the adjustable/variable resistor 516, with the difference between them, I-P2 minus I-N2, flowing across the adjustable/variable resistor 516. The voltage manifested across the adjustable/variable resistor 516 then provides a measure of the current flowing from the output of the amplifier 510. As long as substantially all of the current from the amplifier 510 flows to the load 530, the voltage across the resistor 516 gives an accurate measure of output current.

The first and second current mirrors 512 and 514 preferably do not directly duplicate their input currents (I-P1 and I-N1) but rather provide divided versions thereof. For example, each can provide an output current that is one-tenth its respective input current. Generating divided currents reduces power dissipation in the current mirrors and in the adjustable/variable resistor 516 and allows smaller, less expensive components to be used than would be required with larger currents. Of course, any division applied to one of the current mirrors must be applied to both, to ensure that the output currents combine in the proper proportions.

The second current measuring circuit 550 operates based on a different principle from the first. With the switch 528 closed, feedback around the amplifier 522 forces the voltage across the series element 520 to zero. To maintain this state, the amplifier 522 supplies current to the load 530 via the feedback resistor 524. The differential amplifier 526 measures the voltage across the feedback resistor 524. If it is assumed that substantially all the current through the feedback resistor 524 flows to the load 530, then the output voltage from the differential amplifier 526 provides an accurate measure of output current.

The state of the load 530 determines whether the amplifier 510 or the amplifier 522 provides the output current of the circuit 500. If the load impedance is relatively high, such that only small currents are required, the amplifier 522 may supply the output current. It may continue to do so for increasing currents until the amplifier 522 is unable to complete its feedback (e.g., until its output saturates). When saturation occurs, the amplifier 522 can no longer hold the voltage across the series element 520 to zero, and the series element 520 becomes conductive. Current then flows between the amplifier 510 and the load. If the switch 528 remains closed, the amplifier 522 continues to supply current. Depending on the accuracy requirements of current measurements, the current from the amplifier 522 may be ignored. Generally, however, the switch 528 is opened whenever the series element becomes conductive, thus ensuring that the second current measuring circuit 550 does not become an error-producing, parasitic load to the amplifier 510.

The circuit 500 does not suffer from many of the problems of the circuit shown in FIG. 4. For example, it does not produce output transients when changing its current range. For high current operation, the amplifier 510 supplies the output current, and different current ranges are selected by varying the resistor 516, e.g., by switching in or out different resistors. But this activity occurs away from the amplifier 510. It is neither in its output path nor in its power supply paths. Therefore, switching ranges when the amplifier 510 is supplying the output current does not introduce output transients. For low current operation, the amplifier 522 supplies the output current. However, there is preferably only a single low current range, i.e., that prescribed by the feedback resistor 524. Therefore, no range switching is involved.

The switch 528 is the only component in a position to introduce range-changing transients. However, the switch's operation can be easily managed to avoid transients. For example, the switch 528 can always be closed when programming into a load. If the load causes high current to flow, such that the first current measuring circuit 540 produces a non-zero output, then the switch 528 can be safely opened without introducing a large transient. The transient may not even be measurable. If it is assumed that the amplifier 510 has low output impedance and the series element 520 has low impedance in its conductive state, then the small change in output current caused by opening the switch 528 may produce a nearly infinitesimal voltage change.

The circuit 500 does not suffer from the problem faced by the prior circuit of FIG. 4 when load impedance suddenly changes. For example, when supplying power to a microcontroller in FVMI mode, the circuit 500 can easily accommodate the microcontroller's change from low (idle) current mode to high (operating) current mode. When high current is suddenly demanded, the amplifier 522 saturates and the series element 520 becomes conductive. The amplifier 510 then quickly increases its output current to meet the high current demand, with only a small dip in output voltage. Feedback to the amplifier 510 (not shown) quickly corrects this voltage dip. The microcontroller typically remains operational to allow for further testing.

The first and second current measuring circuits 540 and 550 have different strengths and complement each other. The first current measuring circuit 540 can measure high currents accurately; however, it is generally less accurate when measuring low currents. But the second current measuring circuit 550 excels with low currents. The feedback resistor 524 preferably has a high value, such as 100 k-ohms or more. Very small output currents therefore present adequately large voltages to the differential amplifier 526, which can be measured with high precision. Pairing together the first and second current measuring circuits thus yields a circuit 500 that is accurate throughout a wide range of current.

Figure 6:
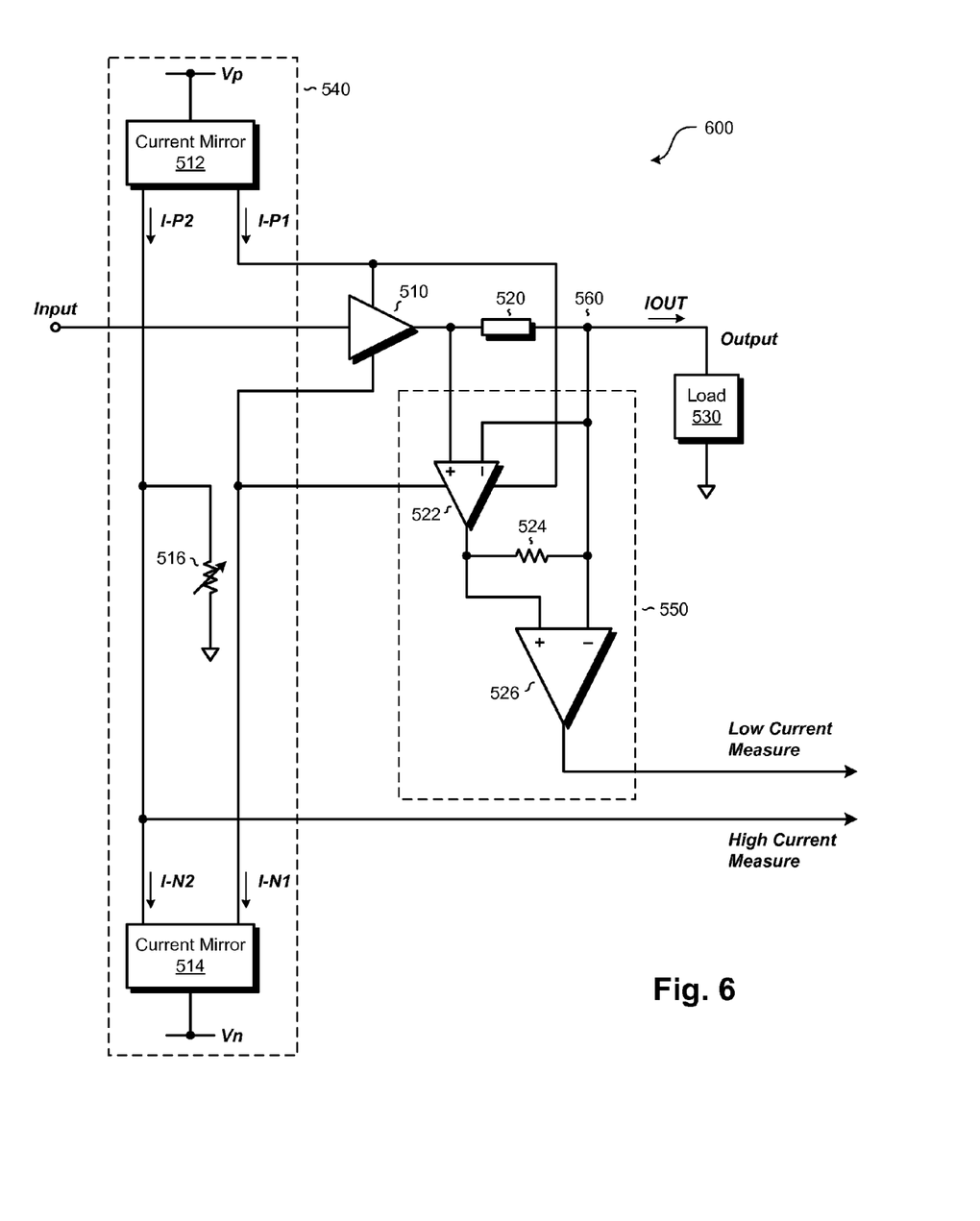
FIG. 6 is a simplified schematic of a circuit for measuring current according to another embodiment of the invention.

FIG. 6 shows a circuit 600 for measuring current according to another illustrative embodiment of the invention. The circuit 600 is identical to the circuit 500, except that no switch 528 is provided for disengaging the second current measuring circuit 550. Also, the power supply leads of the amplifier 522 are coupled to the current mirrors rather than directly to voltage supplies, such as Vp and Vn. As shown, the amplifier 522 has a first power supply node, coupled to the input of the first current mirror 512, and a second power supply node, coupled to the input of the second current mirror 514. With this arrangement, and assuming that both inputs of the differential amplifier 526 are high impedance, all of the current flowing out of the amplifier 522 is accounted for by the first current measuring circuit 540. Within the current mirrors, output currents from the amplifier 522 and the amplifier 510 are simply added. The resulting sum represents the total output current from both sources. The switch 528 is therefore avoided, since it is not necessary to disengage the second current measuring circuit 550 to obtain accurate measurements. The second current measuring circuit 550 is still required, however, for measuring low currents, as the accuracy of the current mirrors 512 and 514 tends to be reduced at low currents. With the switch 528 eliminated, any voltage transients caused by operating the switch, or any sequencing constraints imposed to avoid the consequent transients, are themselves avoided.

Figure 7:
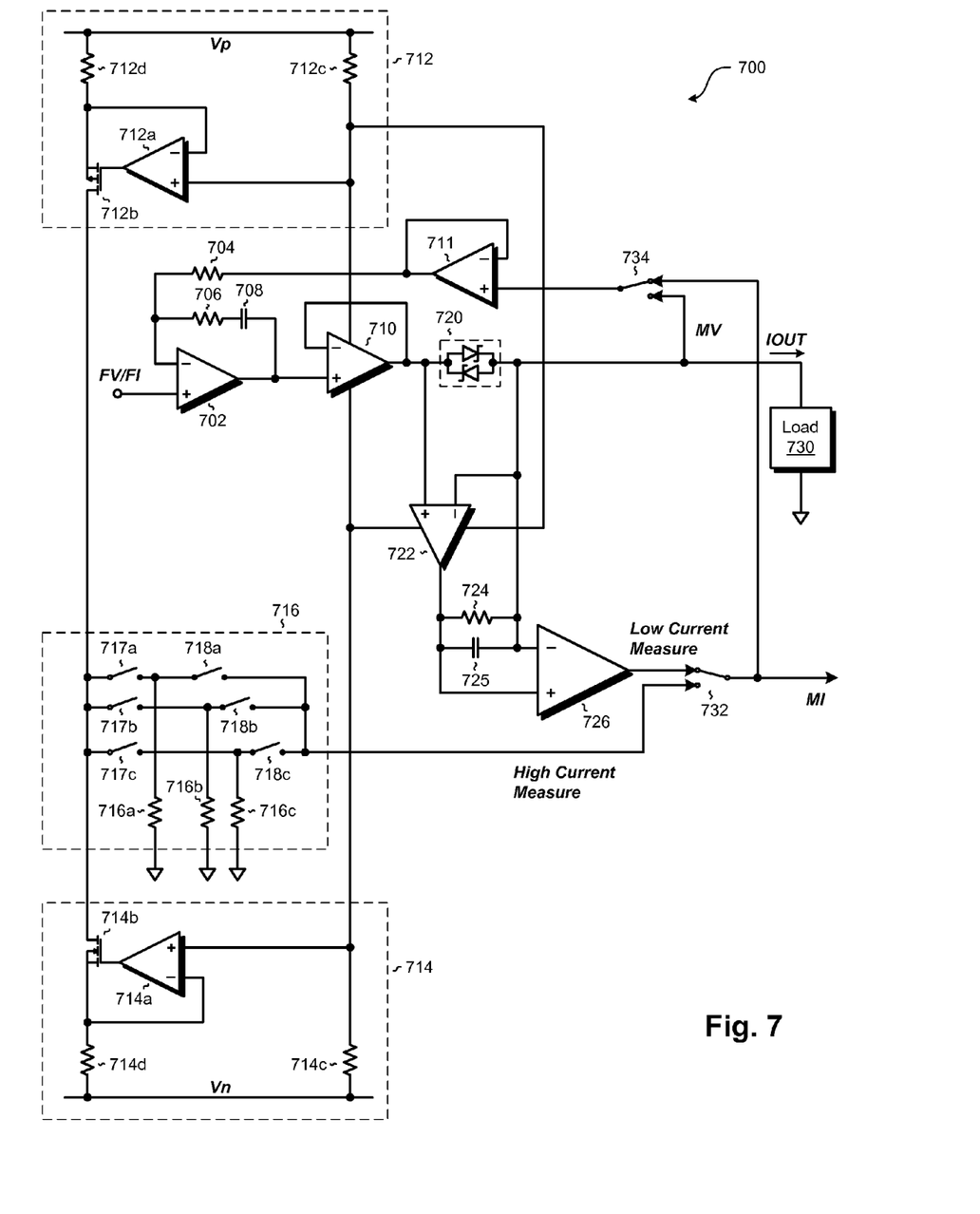
FIG. 7 is a schematic of a circuit for delivering power to a load including a circuit for measuring current according to an embodiment of the invention.

FIG. 7 shows a circuit 700 according to an illustrative embodiment of the invention. The circuit 700 includes a more detailed version of the circuit 600 of FIG. 6, and is shown in an arrangement that can be configured as either an FVMI or an FIMV.

The components of FIG. 7 that have reference numerals similar to those of components in FIGS. 5 and 6 perform similar functions. The amplifier 710 corresponds to the amplifier 510 and is configured as a high current unity-gain buffer. A suitable example of this device is the OPA548 power op amp from Texas Instruments Incorporated. The series element 720 corresponds to the element 520 and is implemented as a pair of antiparallel Schottky diodes. One particularly suitable model is the ZXSDS2M832TA dual Schottky diode pair from Zetex Semiconductors. The op amp 722 corresponds to the amplifier 522 and may be implemented with a wide variety of op amps having low input bias current, such as the LT1884 from Linear Technology in Milpitas, Calif. The differential amplifier 726 corresponds to the amplifier 526 and is preferably implemented as an instrumentation amplifier, such as the LT1167 from Linear Technology. The resistor 724 corresponds to the resistor 524. It preferably has a high resistance, such as 220 k-ohms. A capacitor 725 is preferably connected in parallel with the resistor 724 to reduce noise and improve stability.

The current mirrors 712 and 714 are preferably implemented with op amp circuits. Using op amps rather than transistors alone allows feedback to be applied for maintaining high precision. Op amps 712a and 714a preferably have low input bias currents and, assuming they are powered from Vp and Vn, are able to operate close to their power supply rails. The transistors 712b and 714b may be MOSFETs, JFETs, or BJTs, for example, and are configured with their drains (or collectors) connected together. Resistors 712c and 714c are preferably identical and have resistances of 10-ohms or less; however, their value is expected to vary based on the desired range of currents to be measured. Higher currents require smaller resistors if high output voltage swing of the circuit 700 is to be achieved. Resistors 712d and 714d are preferably identical and have resistances at least ten times greater than those of the resistors 712c and 714c. The higher resistances reduce power dissipation and prevent heating, which promotes accuracy.

The bank of resistors 716 corresponds to the adjustable/variable resistor 516. Individually selectable resistors 716a, 716b, and 716c are shown, which provide three different current ranges. It is understood, however, that the number of resistors used is based on the number of current ranges desired, and a greater or lesser number of resistors may be used. Switches 717a, 717b, and 717c respectively connect the resistors 716a, 716b, and 716c, one at a time, to the outputs of the current mirrors 712 and 714. Switches 718a, 718b, and 718c respectively select the resistors 716a, 716b, and 716c, one at a time, to provide a high current measure signal. The switches 718a, 718b, and 718c are positioned to avoid including voltage drops across the switches 717a, 717b, and 717c in the high current measure signal. To program a particular range, a single resistor is selected. If the resistor 716a is selected, for example, then the switches 717a and 718a should be closed. All of the other switches (717b, 717c, 718b, and 718c) should be opened.

The resistors 712c-d, 714c-d, 716a-c, and 724 are preferably precision resistors of the same type and having the same temperature coefficients. Alternatively, the circuit 700 may employ resistors with less absolute precision; however, the ratios of the different resistors should be precisely controlled to achieve desired accuracy specifications.

The circuit 700 may be configured as either an FVMI, an FIMV, or simply an FI. For this purpose, a control amplifier 702 is provided along with switches 732 and 734 and feedback elements 704, 706, and 708. A feedback buffer 711 may optionally be provided to avoid drawing dynamic current from the output of the circuit 700 or from the current measure outputs. The control amplifier 702 receives an input signal FV/FI indicative of a desired output voltage or current to be supplied to the load 730. The input signal is preferably adjustable or programmable. The switch 732 selects one of the two current measure signals, to deliver a single current measure signal, MI. The switch 734 selects either the current signal MI or the output signal, MV, of the circuit 700, to provide a feedback signal.

To set up the circuit 700 for FVMI operation, the switch 734 is set to its down position to convey the signal MV to the control amplifier (via the feedback buffer 711). The switch 732 is set to either its up or down position, depending on the expected current flow, to provide either a low current measure signal or a high current measure signal. With the circuit 700 configured as a closed-loop feedback circuit, the input signal FV/FI is set to an appropriate level to establish the desired output voltage.

To set up the circuit 700 for FIMV or FI operation, the switch 732 is set based on the desired current. If low output current is desired, the switch 732 is set to its up position to connect the differential amplifier 726 to the feedback buffer 711. If high output current is desired, the switch 732 is set to its down position to connect to the bank of resistors 716. The switch 734 is then set to its up position to convey the MI signal to the feedback buffer 711. The input signal FV/FI is set to an appropriate level to establish the desired output current.

The control amplifier 702 and feedback buffer 711 are preferably op amps with low offset drift, such as the LT1884. Depending on measurement requirements, the power supply leads of the control amplifier 702 may be connected directly to supplies Vp and Vn. However, if the amplifier 710 has high input leakage current, it may be preferable to connect the power supply leads of the control amplifier 702 to the current mirrors, the same way as is done for the amplifier 710.

The circuit 700 is preferably provided as an instrument or portion thereof in a tester 100 for testing electronic components, circuits, or assemblies. The circuit 700 may be controlled by a host computer 110 of the tester, with adjustable settings and signals specified by a test program that runs on the host computer.

The embodiments disclosed herein deliver distinct benefits over prior designs. They significantly reduce or eliminate range switching transients and are able to tolerate extreme and rapid changes in load impedance without losing regulation.

Having described certain embodiments, numerous alternative embodiments or variations can be made. For example, the series element 520/720 has been shown and described as a pair of antiparallel Schottky diodes. However, this is not required. Although Schottky diodes are preferred for their small forward voltage drops and low charge storage, other types of diodes may be used, such as conventional P-N diodes or zener diodes. Instead of using diodes, a transistor circuit could be employed. Essentially, any circuit may be used that presents high impedance at or near zero volts and low impedance at higher voltages.

As shown and described, the first current measuring circuit 540 includes resistors that may be selected one at a time for providing different current ranges. This is merely an example, however. Alternatively, the circuit 540 may be constructed so that greater than one resistor may be selected at a time, for providing different resistor combinations. In addition, one or more variable resistors could be used, including programmable resistors.

As shown and described, the circuits 500, 600, and 700 include only a single low current range. However, multiple ranges could be provided, such as by including a bank of resistors in place of the resistor 524/724, or by making the resistor 524/724 a variable resistor. Output transients may appear when current ranges are changed; however, these are likely to be small since the currents involved are themselves generally small. In addition, the current mirrors themselves may be equipped with different current ranges. Multiple, selectable resistors, or variable resistors, can be used in place of any of the resistors 712c/714c and 712d/714d, to provide additional flexibility.

Figure 8:
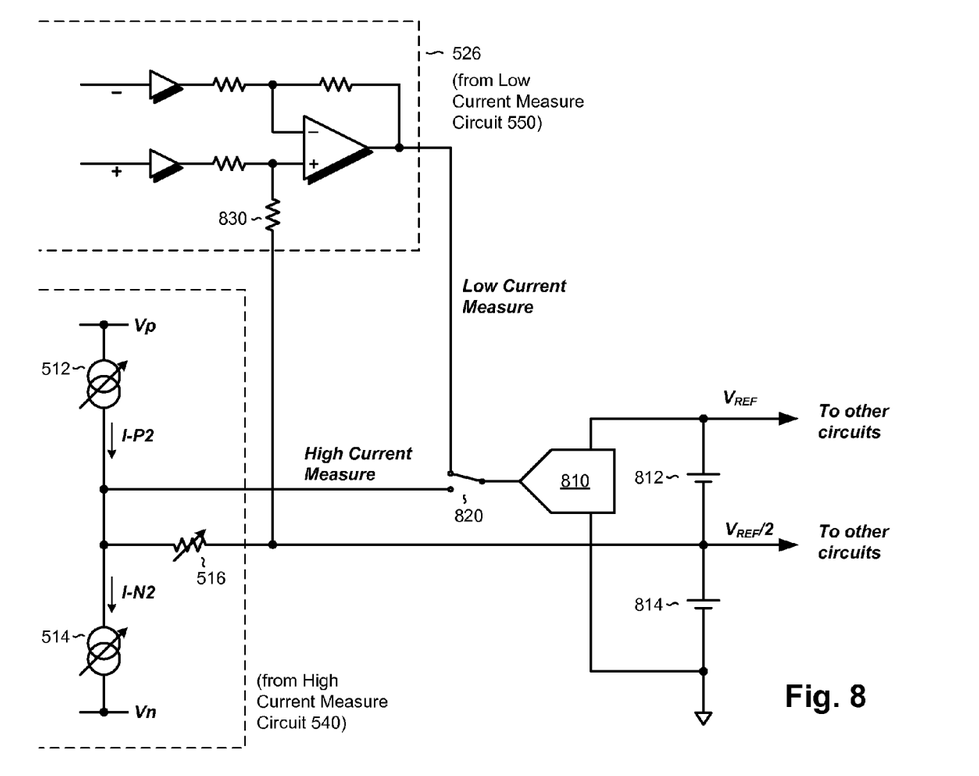
FIG. 8 is a schematic of a first circuit for measuring current in connection with any of the circuits shown in FIGS. 5-7 using a uni-polar analog-to-digital converter.
Figure 9:
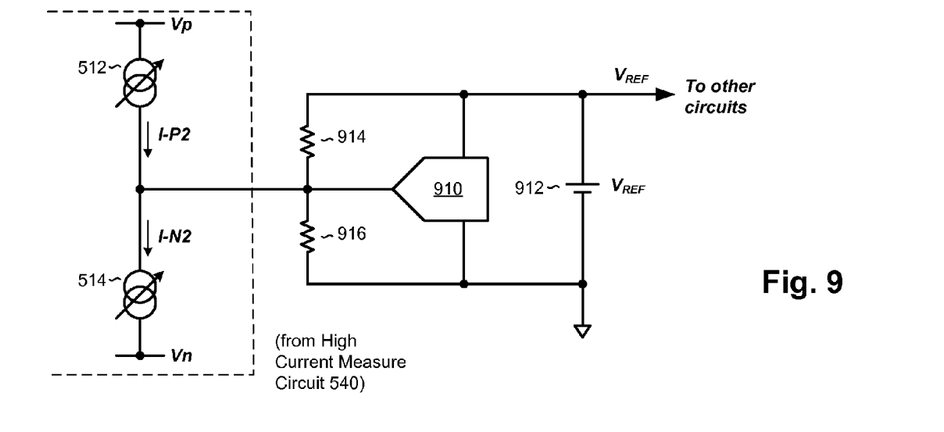
FIG. 9 is a schematic of a second circuit for measuring current in connection with any of the circuits shown in FIGS. 5-7 using a uni-polar analog-to-digital converter.

FIGS. 8 and 9 show additional variants of the invention, which enable one conveniently to a use uni-polar analog-to-digital converter (ADC) for measuring currents from the circuits shown in FIGS. 5, 6, and 7. As shown and described previously, the high current measuring circuit 540 produces an output voltage across the resistor 516 that may be either positive or negative, depending on the polarity of the measured current. Similarly, the low current measuring circuit 550 produces an output voltage from the differential amplifier 526 that varies between positive and negative values. The outputs of these circuits are thus well suited for presentation to a bi-polar ADC. With slight modifications, however, each of these circuits can be re-referenced for use with a uni-polar ADC. As shown in FIG. 8, a uni-polar ADC 810 is provided with a reference input $V_{REF}$. The ADC 810 has a high impedance input connected to a switch 820. The switch 820 has a first position, in which the input of the ADC is connected to the output of the high current measuring circuit 540 for allowing high current measurements, and a second position, in which the input of the ADC is connected to the output of the low current measuring circuit 550 for allowing low current measurements. A simplified portion of the high current measuring circuit 540 is shown. Within the high current measuring circuit 540, the side of the resistor 516 that is normally connected to ground in FIGS. 5 and 6 is instead connected to a reference voltage, such as $V_{REF}/2$. With this arrangement, output voltages produced by the high current measuring circuit 540 vary over a range of positive voltages only, with negative currents represented by voltages between zero and $V_{REF}/2$ and positive currents represented by voltages between $V_{REF}/2$ and $V_{REF}$. A portion of the low current measuring circuit is also shown, with details of the differential amplifier 526 revealed. A resistor 830 within the differential amplifier 526, which would normally be connected to ground for bi-polar operation, is instead also connected to $V_{REF}/2$. This change has the effect of offsetting the entire range of outputs to positive only values. It is understood that various types of circuits may be used to implement the differential amplifier 526, some of which include a reference pin that is normally connected to ground. A comparable re-referencing effect can generally be obtained with those circuits by connecting that pin instead to $V_{REF}/2$.

The reference voltages $V_{REF}$ and $V_{REF}/2$ may be produced in a variety of ways known to those skilled in the art, such as with op amp circuits used to buffer and scale a precision reference. In systems containing more than one high current measuring circuit, it is possible to produce the reference levels $V_{REF}$ and $V_{REF}/2$ only once and to distribute them to all of the high current measuring circuits, thus eliminating duplication. In some applications, the reference level $V_{REF}/2$ may be provided at some different voltage, such as $V_{REF}/4$ or $3V_{REF}/4$, if the positive and negative ranges of currents to be measured are not symmetrical.

FIG. 9 shows an arrangement for adapting the high current measuring circuit 540 for use with a uni-polar ADC. The circuit of FIG. 9 is not directly applicable to the low-current measuring circuit 550. As shown in FIG. 9, two resistors 914 and 916 are provided in place of the resistor 516. The resistor 914 is connected to $V_{REF}$ and the resistor 916 is connected to ground. The arrangement of FIG. 9 produces positive voltages when measuring both positive and negative currents. It requires one fewer reference voltage and one more resistor than the arrangement of FIG. 8. But since the additional resistor would generally have to be a bank of resistors or a variable resistor, the arrangement shown in FIG. 8 would generally be the better choice, except where only a single high current range is desired.

Those skilled in the art will therefore understand that various changes in form and detail may be made to the embodiments disclosed herein without departing from the scope of the invention.

What is claimed is:

1. A circuit for measuring current to a load, comprising:
   an output node for coupling to the load;
   an amplifier having an output, a first power supply node, and a second power supply node;
   a first current measuring circuit, coupled to the first and second power supply nodes of the amplifier and having an output for providing a first indication of current to the load; and
   a second current measuring circuit, coupled between the output of the amplifier and the output node and having an output for providing a second indication of current to the load.

2. A circuit as recited in claim 1, wherein the first current measuring circuit has a plurality of different current ranges.

3. A circuit as recited in claim 2, wherein the second current measuring circuit has a single current range.

4. A circuit as recited in claim 1, further comprising a switch for selectively preventing current flow between the second current measuring circuit and the output node.

5. A circuit as recited in claim 1, wherein the amplifier is a first amplifier and the second current measuring circuit comprises:
   a second amplifier having a first input, a second input, and an output, the first input coupled to the output of the first amplifier, a second input coupled to the output node;
   an impedance coupled between the output of the second amplifier and the output node; and
   a differential amplifier coupled to the impedance for measuring current flow through the impedance.

6. A circuit as recited in claim 5, wherein the second amplifier has first and second power supply nodes coupled to the first current measuring circuit.

7. A circuit as recited in claim 5, wherein the impedance comprises a resistor in parallel with a capacitor.

8. A circuit as recited in claim 5, further comprising a series element coupled between the output of the first amplifier and the output node.

9. A circuit as recited in claim 8, wherein the series element comprises at least one semiconductor device.

10. A circuit as recited in claim 9, wherein the at least one semiconductor device comprises a pair of antiparallel connected diodes.

11. A circuit as recited in claim 8, wherein the series element has a high impedance when substantially 0 volts are applied across it and a lower impedance when a greater voltage is applied across it.

12. A circuit as recited in claim 1, wherein the first current measuring circuit comprises:
   a first current mirror having an input coupled to the first power supply node of the amplifier for receiving a first current and an output for supplying a current proportional to the first current;
   a second current mirror having an input coupled to the second power supply node of the amplifier for receiving a second current and an output for supplying a current proportional to the second current; and
   at least one impedance coupled to the output of the first current mirror and the output of the second current mirror for providing the output of the first current measuring circuit.

13. A circuit as recited in claim 12, wherein said at least one impedance comprises a variable resistor.

14. A circuit as recited in claim 12, wherein said at least one impedance comprises a plurality of resistors that are individually selectable for providing different current ranges.

15. A circuit as recited in claim 12, further comprising a uni-polar analog-to-digital converter (ADC) having an input coupled to the output of the first current mirror and the output of the second current mirror.

16. A circuit as recited in claim 15, further comprising first and second reference voltages $V_{REF}$ and $V_{REF}/2$, wherein said at least one impedance has first and second sides, the first side coupled to the outputs of the first and second current mirrors, wherein the ADC has a reference input coupled to $V_{REF}$, and wherein the second side of said at least one impedance is coupled to $V_{REF}/2$.

17. A circuit as recited in claim 15, wherein said at least one impedance comprises a first impedance and a second impedance each having first and second sides, the first side of the first and second impedances coupled to the outputs of the first and second current mirrors, the circuit further comprising a reference voltage $V_{REF}$, wherein the ADC has a reference input and a ground input, the reference input of the ADC coupled to $V_{REF}$ and to the second side of the first impedance and the ground coupled to the second side of the second impedance.

18. A circuit as recited in claim 14, wherein the first current measuring circuit further comprises a plurality of switches, one for each of the plurality of resistors, each of the plurality of switches having a first node coupled to the output of the first current mirror and the output of the second current mirror and a second node coupled to a respective one of the plurality of resistors.

19. A circuit as recited in claim 18, wherein the plurality of switches is a first plurality of switches, the first current measuring circuit further comprising a second plurality of switches, each having a first node coupled to a respective one of the plurality of resistors and a second node coupled to the output of the first current measuring circuit.

20. A circuit for providing electrical power to a load, comprising:
   an output node for connecting to the load;
   an amplifier having a first input for receiving an input signal, a second input for receiving a feedback signal, a first power supply node, a second power supply node, and an output;
   a low current measuring circuit coupled between the output of the amplifier and the output node and having an output for providing a low current measurement signal;
   a high current measuring circuit coupled to the first and second power supply nodes of the amplifier and having an output for providing a high current measurement signal; and
   a feedback path coupled between the second input of the amplifier and one of the output node, the output of the low current measuring circuit, and the output of the high current measuring circuit.

21. A circuit as recited in claim 20, wherein the input signal is indicative of a desired voltage to be provided by the circuit, and the feedback path is coupled between the second input of the amplifier and the output node.

22. A circuit as recited in claim 20, wherein input signal is indicative of a desired current to be provided by the circuit, and the feedback path is coupled between the second input of the amplifier and one of the output of the low current measuring circuit and the output of the high current measuring circuit.

23. A circuit as recited in claim 20, wherein the feedback path comprises a switch having a first input coupled to the output of the low current measuring circuit, a second input coupled to the output of the high current measuring circuit, and an output coupled to the second input of the amplifier.

24. A method of measuring current flowing to a load, comprising:
   providing a first amplifier having an output for coupling to the load;
   providing a second amplifier having an input coupled to the output of the first amplifier and an output for coupling to the load;
   measuring a difference between a first supply current and a second supply current of the first amplifier to produce a first indication of current flowing to the load; and
   measuring a current from the output of the second amplifier to produce a second indication of current flowing to the load.

25. A circuit for measuring current flowing to a load, comprising:
   an output node for coupling to the load;
   a first amplifier having first and second power supply nodes and an output coupled to the output node;
   a second amplifier having an input coupled to the output of the first amplifier and an output coupled to the output node;
   a first measuring circuit, coupled to the first and second power supply nodes of the first amplifier, for measuring current flow between the first amplifier and the load; and
   a second measuring circuit, coupled to the second amplifier, for measuring current flow between the second amplifier and the output node.

26. A circuit for measuring current flowing to a load, comprising:
   an output node for coupling to the load;
   a first amplifier having first and second power supply nodes and an output;
   a series element having a first node coupled to the output of the first amplifier and a second node coupled to the output node, the series element having a high impedance between the first and second nodes when substantially zero volts are applied therebetween and having a lower impedance between the first and second nodes when a greater voltage is applied therebetween;
   a second amplifier having first and second inputs coupled respectively to the first and second nodes of the series element, and an output coupled to the second node of the series element for maintaining substantially 0 volts across the series element when low current is being delivered to the load; and
   a measurement circuit coupled to the first and second power supply nodes of the first amplifier for measuring current to the load when a high current is being delivered to the load.

* * * * *